(12) United States Patent
Ryu (10) Patent No.: US 11,075,295 B2
(45) Date of Patent: Jul. 27, 2021

(54) WIDE BANDGAP SEMICONDUCTOR DEVICE

(71) Applicant: Cree, Inc., Durham, NC (US)

(72) Inventor: Sei-Hyung Ryu, Cary, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 16/034,536

(22) Filed: Jul. 13, 2018

(65) Prior Publication Data

US 2020/0020793 A1 Jan. 16, 2020

(51) Int. Cl.
| | | |
|---|---|---|
| H01L 29/78 | (2006.01) | |
| H01L 29/06 | (2006.01) | |
| H01L 29/10 | (2006.01) | |
| H01L 29/16 | (2006.01) | |
| H01L 29/66 | (2006.01) | |
| H01L 29/08 | (2006.01) | |
| H01L 29/80 | (2006.01) | |

(52) U.S. Cl.
CPC ...... *H01L 29/7803* (2013.01); *H01L 29/0607* (2013.01); *H01L 29/0688* (2013.01); *H01L 29/0696* (2013.01); *H01L 29/0878* (2013.01); *H01L 29/1095* (2013.01); *H01L 29/1608* (2013.01); *H01L 29/66068* (2013.01); *H01L 29/7802* (2013.01); *H01L 29/80* (2013.01)

(58) Field of Classification Search
CPC .......... H01L 29/0696; H01L 29/0607; H01L 29/7803; H01L 29/06; H01L 29/0603; H01L 29/0878; H01L 29/7802

See application file for complete search history.

(56) References Cited

U.S. PATENT DOCUMENTS

| | | | |
|---|---|---|---|
| 6,207,993 B1 | 3/2001 | Ishimura et al. | |
| 8,217,448 B2 * | 7/2012 | Stefanov | H01L 29/0878 |
| | | | 257/327 |

(Continued)

FOREIGN PATENT DOCUMENTS

| | | |
|---|---|---|
| JP | H05299658 A | 11/1993 |
| JP | 2001144102 A | 5/2001 |
| JP | 2008004872 A | 1/2008 |

OTHER PUBLICATIONS

International Search Report and Written Opinion for International Patent Application No. PCT/US2019/040712, dated Oct. 11, 2019, 16 pages.

(Continued)

*Primary Examiner* — Matthew C Landau
*Assistant Examiner* — Mark Hatzilambrou
(74) *Attorney, Agent, or Firm* — Withrow & Terranova, PLLC (57) ABSTRACT

A metal-oxide-semiconductor field-effect transistor includes a wide bandgap substrate, a wide bandgap drift layer over the substrate, a number of junction implants in the drift layer, and a JFET region between the junction implants. The JFET region is defined by a JFET gap, which is the distance between adjacent ones of the junction implants. The JFET gap is not uniform throughout the MOSFET device. The JFET region is separated into a first JFET sub-region and a second JFET sub-region, such that a doping concentration in the first JFET sub-region is different from a doping concentration in the second JFET sub-region.

22 Claims, 6 Drawing Sheets

(56) References Cited

U.S. PATENT DOCUMENTS

2011/0095305 A1\* 4/2011 Yamashita .......... H01L 29/0696
257/77
2017/0338313 A1 11/2017 Bolotnikov et al.

OTHER PUBLICATIONS

International Preliminary Report on Patentability for International Patent Application No. PCT/US2019/040712, dated Jan. 28, 2021, 10 pages.

\* cited by examiner

WIDE BANDGAP SEMICONDUCTOR DEVICE

FIELD OF THE DISCLOSURE

The present disclosure relates to semiconductor devices, and in particular to wide bandgap semiconductor devices having high channel packing density that maintain a high blocking voltage and low on-state resistance.

BACKGROUND

Wide bandgap semiconductor devices are preferred for a variety of applications due to their ability to withstand high blocking voltages, provide low on-state resistance, and operate at higher frequencies and temperatures than their narrow bandgap counterparts. Those skilled in the art will appreciate that the significant advantages offered by wide bandgap semiconductor devices in some aspects of operation often come at the expense of disadvantages in other aspects of operation. One such disadvantage is that wide bandgap semiconductor devices suffer from very concentrated electric fields forming therein. These concentrated electric fields may cause damage to the device if they are not properly managed, and further may reduce the ability of wide bandgap semiconductor devices to block voltages above a certain level without failure. Accordingly, there is a need for wide bandgap semiconductor devices that reduce the concentration of electric fields therein.

SUMMARY

In one embodiment, a metal-oxide-semiconductor field-effect transistor (MOSFET) includes a wide bandgap substrate, a wide bandgap drift layer over the substrate, a number of junction implants in the wide bandgap drift layer, and a junction field-effect transistor (JFET) region between the junction implants. The JFET region is defined by a JFET gap, which is the distance between adjacent ones of the junction implants. The JFET gap is not uniform throughout the MOSFET device. The JFET region is separated into a first JFET sub-region and a second JFET sub-region, such that a doping concentration in the first JFET sub-region is different from a doping concentration in the second JFET sub-region. By separating the JFET region into the first JFET sub-region and the second JFET sub-region, the trade-off between on-state resistance, blocking voltage, and peak electric field may be designed locally for the sub-regions, thereby improving the overall performance of the MOSFET device.

In one embodiment, the JFET gap within the first JFET sub-region is different than the JFET gap within the second JFET sub-region. In particular, the JFET gap within the first JFET sub-region may be smaller than the JFET gap within the second JFET sub-region. The doping concentration within the first JFET sub-region may be greater than the doping concentration within the second JFET sub-region. The doping concentration in the JFET region may vary in a linear, exponential, or step-wise manner between the first JFET sub-region and the second JFET sub-region.

In one embodiment, the MOSFET device provides an area normalized on-state resistance less than 2 $m\Omega\text{-}cm^2$ and is capable of blocking at least 650 V. The MOSFET device may have a MOS channel packing density greater than 370 $mm/mm^2$.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 1:
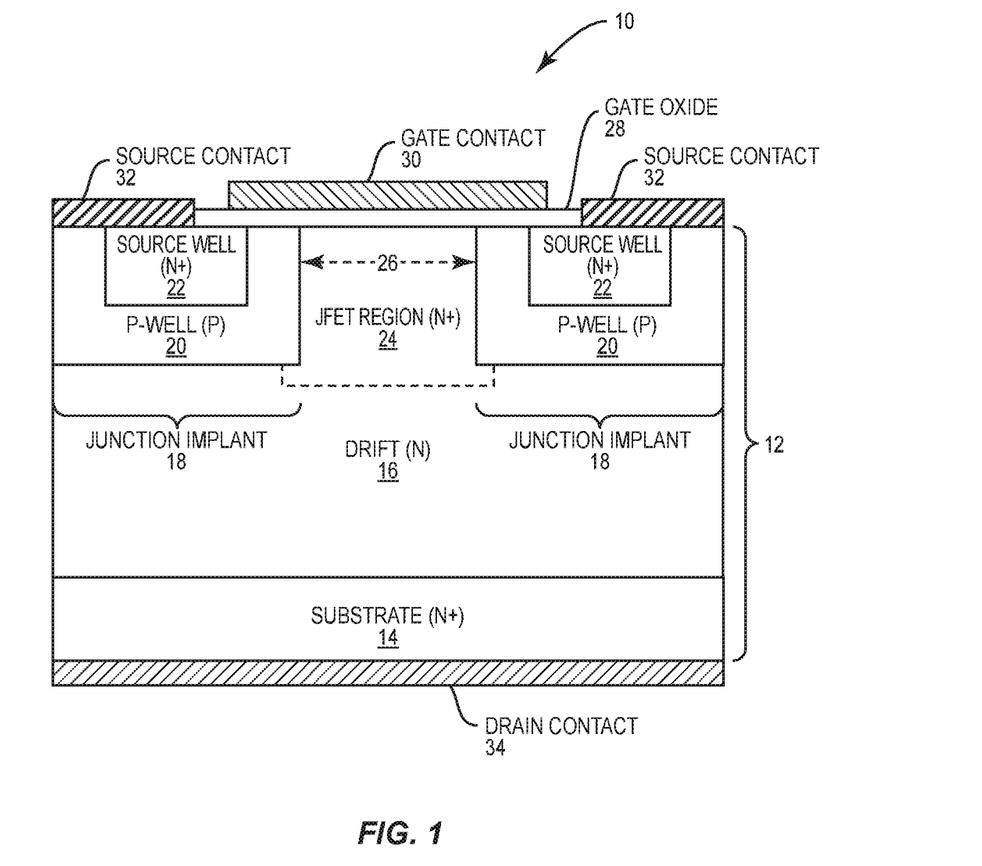
FIG. 1 illustrates a cross-sectional view of a metal-oxide-semiconductor field-effect transistor (MOSFET) cell according to one embodiment of the present disclosure.

FIG. 1 illustrates a vertical metal-oxide-semiconductor field-effect transistor (MOSFET) cell 10 according to one embodiment of the present disclosure. The MOSFET cell 10 includes semiconductor stack 12 including a substrate 14 and a drift layer 16 over the substrate 14. The drift layer 16 includes a number of junction implants 18, each of which include a p-well 20 and a source well 22 such that the source well 22 is within and may be encapsulated by the p-well 20. The junction implants 18 are separated from one another by a junction field-effect transistor (JFET) region 24, which is defined by a distance between each one of the junction implants 18 known as a JFET gap 26. A gate oxide layer 28 is on a surface of the drift layer 16 opposite the substrate 14 such that the gate oxide layer 28 extends between the source well 22 of each one of the junction implants 18. A gate contact 30 is over the gate oxide layer 28. A source contact 32 is on the surface of the drift layer 16 opposite the substrate 14 such that the source contact 32 is over a portion of the p-well 20 and the source well 22 in each one of the junction implants 18. A drain contact 34 is on a surface of the substrate 14 opposite the drift layer 16.

As shown in FIG. 1, the substrate 14 is a heavily doped n-type layer. In various embodiments, the doping concentration of the substrate 14 may be between $1\times10^{18}$ cm$^{-3}$ and $1\times10^{20}$ cm$^{-3}$, between $1\times10^{19}$ cm$^{-3}$ and $1\times10^{20}$ cm$^{-3}$, and between $1\times10^{18}$ cm$^{-3}$ and $1\times10^{19}$ cm$^{-3}$. The drift layer 16 may be an n-type layer with a doping concentration that is less than the substrate 14. In some embodiments, the doping concentration of the drift layer 16 may be between $1\times10^{14}$ cm$^{-3}$ and $1\times10^{17}$ cm$^{-3}$, between $1\times10^{15}$ cm$^{-3}$ and $1\times10^{17}$ cm$^{-3}$, between $1\times10^{16}$ cm$^{-3}$ and $1\times10^{17}$ cm$^{-3}$, between $1\times10^{14}$ cm$^{-3}$ and $1\times10^{16}$ cm$^{-3}$, and between $1\times10^{14}$ cm$^{-3}$ and $1\times10^{15}$ cm$^{-3}$. Further, the doping concentration of the drift layer 16 may be graded such that a doping concentration of the drift layer 16 increases in proportion to a distance from the substrate 14. The grading may be linear, exponential, step-wise, or in any other configuration. Generally, the drift layer 16 is grown on the substrate 14 via an epitaxy process. The JFET region 24 may be a highly doped n-type region with a doping concentration between $5\times10^{15}$ cm$^{-3}$ and $2\times10^{17}$ cm$^{-3}$, between $5\times10^{16}$ cm$^{-3}$ and $2\times10^{17}$ cm$^{-3}$, and between $5\times10^{15}$ cm$^{-3}$ and $2\times10^{16}$ cm$^{-3}$. The JFET region 24 may be implanted via an ion implantation process or grown via an epitaxy process (e.g., by first etching a trench in the drift layer 16). The p-well 20 of each one of the junction implants 18 may be a p-type region having a doping concentration between $5\times10^{15}$ cm$^{-3}$ and $5\times10^{19}$ cm$^{-3}$, between $5\times10^{16}$ cm$^{-3}$ and $5\times10^{19}$ cm$^{-3}$, between $5\times10^{17}$ cm$^{-3}$ and $5\times10^{19}$ cm$^{-3}$, between $5\times10^{18}$ cm$^{-3}$ and $5\times10^{19}$ cm$^{-3}$, between $5\times10^{15}$ cm$^{-3}$ and $5\times10^{18}$ cm$^{-3}$, between $5\times10^{15}$ cm$^{-3}$ and $5\times10^{17}$ cm$^{-3}$, and between $5\times10^{15}$ cm$^{-3}$ and $5\times10^{16}$ cm$^{-3}$. The source well 22 of each one of the junction implants 18 may be a highly doped n-type region having a doping concentration between $5\times10^{18}$ cm$^{-3}$ and $5\times10^{21}$ cm$^{-3}$, between $5\times10^{18}$ cm$^{-3}$ and $5\times10^{20}$ cm$^{-3}$, between $5\times10^{18}$ cm$^{-3}$ and $5\times10^{19}$ cm$^{-3}$, between $5\times10^{19}$ cm$^{-3}$ and $5\times10^{21}$ cm$^{-3}$, and between $5\times10^{20}$ cm$^{-3}$ and $5\times10^{21}$ cm$^{-3}$. The p-well 20 and the source well 22 of the junction implants 18 are generally implanted via an ion implantation process.

While the MOSFET cell 10 is shown in FIG. 1 as an NMOS device wherein the substrate 14 and the drift layer 16 are n-type layers, the principles of the present disclosure apply equally to PMOS devices in which the substrate 14 and the drift layer 16 are p-type layers.

While there are many design parameters of a MOSFET device that may affect the performance thereof, two of these design parameters are particularly notable with respect to the disclosure discussed herein. The first notable design parameter of the MOSFET cell 10 is the distance between the junction implants 18, or the JFET gap 26. Increasing the JFET gap 26 will decrease the on-state resistance of the MOSFET cell 10, but will also decrease the blocking voltage thereof. Further, increasing the JFET gap 26 will generally increase the peak electric field at a center of the JFET region 24. Decreasing the JFET gap 26 will increase the blocking voltage of the MOSFET cell 10, but will also increase the on-state resistance thereof. Further, decreasing the JFET gap 26 will generally decrease the peak electric field at the center of the JFET region 24. The second notable design parameter of the MOSFET cell 10 is the doping concentration of the JFET region 24. Increasing the doping concentration of the JFET region 24 will decrease the on-state resistance of the MOSFET cell 10, but will also increase the peak electric field at a center of the JFET region 24. Decreasing the doping concentration of the JFET region 24 will decrease the peak electric field at the center of the JFET region 24, but will also increase the on-state resistance of the MOSFET cell 10. Accordingly, both the JFET gap 26 and the doping concentration of the JFET region 24 must be appropriately chosen to meet a desired blocking voltage, on-state resistance, and peak electric field for the MOSFET cell 10. Notably, if the peak electric field at the center of the JFET region 24 becomes too high, it will rupture the gate oxide and destroy the MOSFET cell 10. As discussed above, the concentration of electric fields is especially problematic in wide bandgap material systems such as silicon carbide (SiC) devices, which generally have much higher electric fields than their narrow bandgap counterparts. In designing the MOSFET cell 10, the JFET gap 26 and doping concentration for the JFET region 24 are thus chosen to provide a desired relationship between on-state resistance, blocking voltage, and peak electric field.

Notably, the MOSFET cell 10 is so named because it is the smallest unit of a larger MOSFET device. A MOSFET device includes hundreds or thousands of MOSFET cells repeated in various geometric configurations. The MOSFET cell 10 shown in FIG. 1 is represented as a two-dimensional cross-section. In reality, the MOSFET cell 10 extends into and out of the page in three dimensions as a rectangular cuboid. The MOSFET cell 10 may be mirrored or repeated extending into and out of the page. Further, the MOSFET cell 10 may be symmetrically mirrored on its left and right sides and may continue to repeat in this manner to achieve a desired size. The combination of MOSFET cells 10 arranged as described forms a MOSFET device. The gate contacts 30, source contacts 32, and drain contacts 34 of the MOSFET cells 10 are tied together so that the MOSFET cells 10 are operated together as a MOSFET device.

Figure 2:
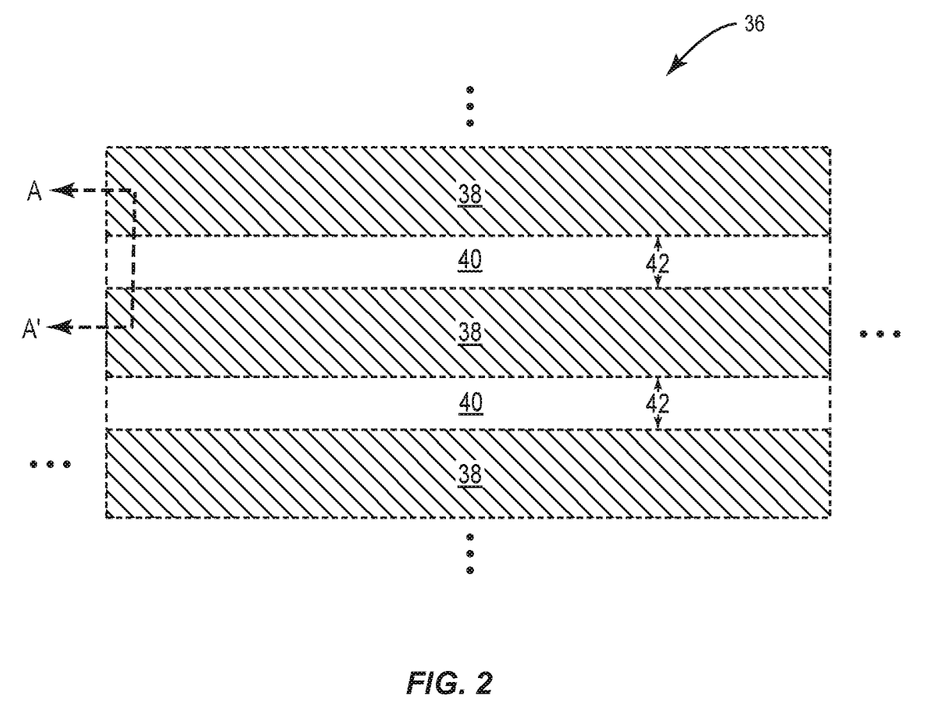
FIG. 2 illustrates a top-down view of a MOSFET device according to one embodiment of the present disclosure.

The above is best visualized by viewing a MOSFET device from the top-down. Accordingly, FIG. 2 shows a top down view of a MOSFET device 36 including a number of junction implants 38 therein. The gate oxide, gate contacts, and source contacts are not shown in FIG. 2. While the junction implants 38 may contain several different implants having different doping types, they are represented in FIG. 2 as a single shaded area to better illustrate the concepts discussed herein. The area between the junction implants 38 is a JFET region 40 of the MOSFET device 36. The MOSFET cell 10 shown in FIG. 1 may represent a cross-sectional view of the MOSFET device 36 shown in FIG. 2 through line A-A'. The configuration shown in FIG. 2 is often referred to as a "stripe" MOSFET design, since the junction implants 38 are striped across the device.

As discussed above, two notable design parameters of the MOSFET device 36 are a JFET gap 42 and the doping concentration of the JFET region 40. Choosing these parameters for the MOSFET device 36 such as the one described with respect to FIG. 2 is relatively straightforward due to the fact that the JFET gap 42 is uniform throughout the device. While the simplicity of the MOSFET device 36 is advantageous in this respect, MOSFET devices in recent years have trended away from strip-based designs towards cell-based designs to achieve a higher cell (or MOS channel) packing density, which increases the performance of the MOSFET device 36.

Figure 3:
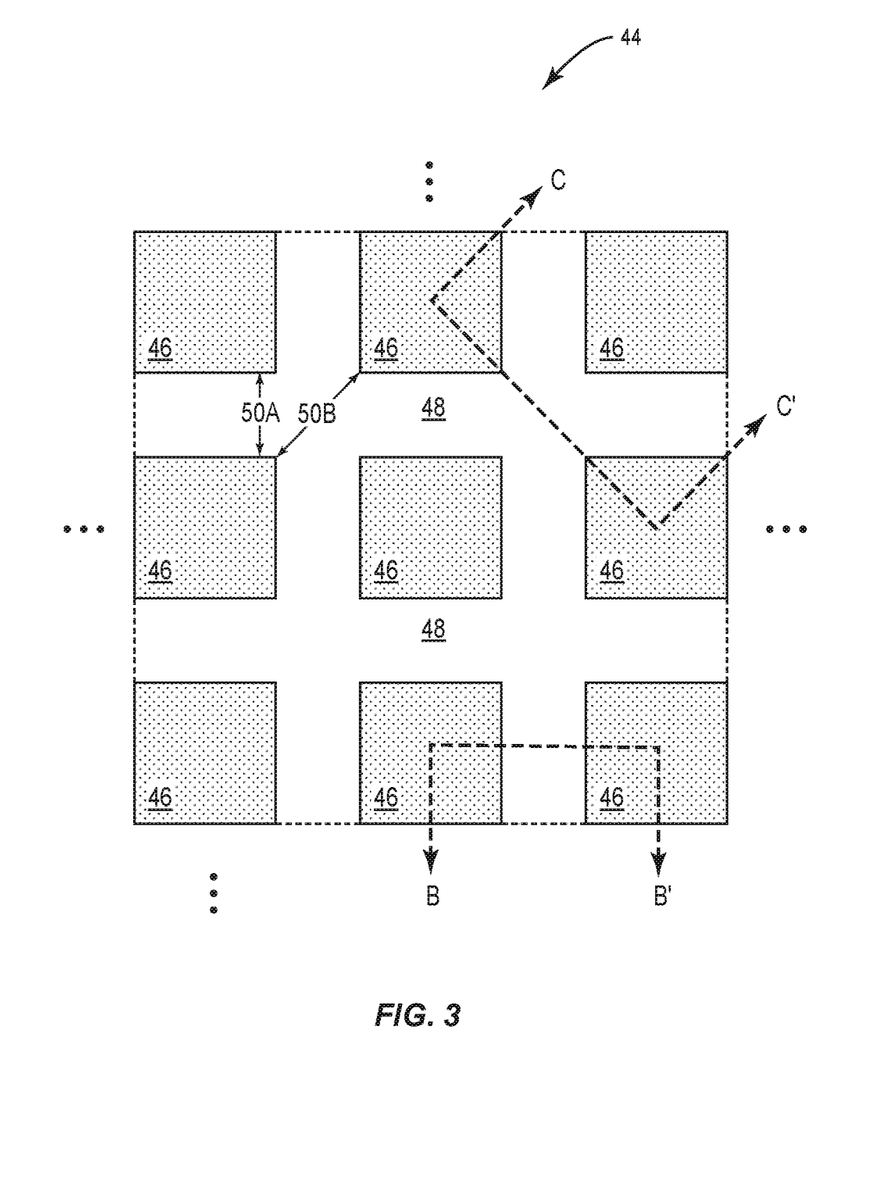
FIG. 3 illustrates a top-down view of a MOSFET device according to one embodiment of the present disclosure.

FIG. 3 shows a top-down view of a MOSFET device 44 including a number of junction implants 46 arranged in a cell configuration. In particular, FIG. 3 shows the MOSFET device 44 having a rectangular cell configuration. The gate oxide, gate contacts, and source contacts are not shown in FIG. 3. While the junction implants 46 may contain several different implants having different doping types, they are represented in FIG. 3 as a single shaded area to better illustrate the concepts discussed herein. The area between the junction implants 46 is a JFET region 48 of the MOSFET device 44. As discussed above, two notable design parameters of the MOSFET device 44 are the distance between the junction implants 46, or a JFET gap 50, and the doping concentration of the JFET region 48. The cell configuration of the MOSFET device 44 shown in FIG. 3 complicates the design thereof due to the fact that the JFET gap 50 is not the same in all areas of the device. In particular, a first JFET gap 50A is provided between adjacent junction implants 46 having parallel faces, while a second JFET gap 50B is provided between adjacent junction implants 46 that do not have parallel faces. This is illustrated by lines B-B' and C-C', respectively, in FIG. 3. The MOSFET cell 10 shown in FIG. 1 may represent a cross-sectional view of the MOSFET device 44 shown in FIG. 3 through both lines B-B' and C-C'.

The only difference between the MOSFET cells through these lines is the JFET gap 50, which will be significantly larger for the MOSFET cell formed through line C-C' than for the MOSFET cell formed through line B-B'.

As discussed above, increasing the JFET gap 50 increases a peak electric field at the center of the JFET region 48. Due to a relatively large second JFET gap 50B in the MOSFET device 44, the most concentrated electric field in the device forms around a center point of the second JFET gap 50B. Conventionally, the JFET region 48 has been a uniformly doped region. According to conventional design principles, the doping concentration of the JFET region 48 is adjusted to accommodate for the most concentrated electric field in the MOSFET device 44, which forms at the center point between junction implants 46 that are adjacent but do not have parallel faces. In particular, the doping concentration of the JFET region 48 is lowered to reduce the peak electric field in this area to an acceptable level to avoid damaging the MOSFET device 44 (e.g., by rupturing the gate oxide thereof).

Notably, the doping concentration necessary to reduce the peak electric field to an acceptable level in the portion of the JFET region 48 between the junction implants 46 that are adjacent but do not have parallel faces is significantly lower than the doping concentration necessary to reduce the peak electric field to an acceptable level in the portion of the JFET region 48 between junction implants 46 that are adjacent and have parallel faces. When the doping concentration of the JFET region 48 is uniform in the MOSFET device 44, only the areas of the MOSFET device 44 where the junction implants 46 are separated by the second JFET gap 50B are optimized for, since this is the portion of the device that the doping concentration of the JFET region 48 is chosen for. In other words, the uniform doping concentration of the JFET region 48 results in a sub-optimal tradeoff between on-state resistance, blocking voltage, and peak electric field in the areas of the MOSFET device 44 where the junction implants 46 are separated by the first JFET gap 50A. When using wide bandgap material systems such as SiC, conventional designs in which the JFET region 48 is uniformly doped preclude the MOSFET device 44 from achieving certain combinations of on-state resistance and blocking voltage because they are not achievable when the doping concentration of the JFET region 48 is lowered to a level at which damage to the device due to the peak electric field in the areas of the MOSFET device 44 where the junction implants 46 are separated by the second JFET gap 50B will no longer occur.

Figure 4:
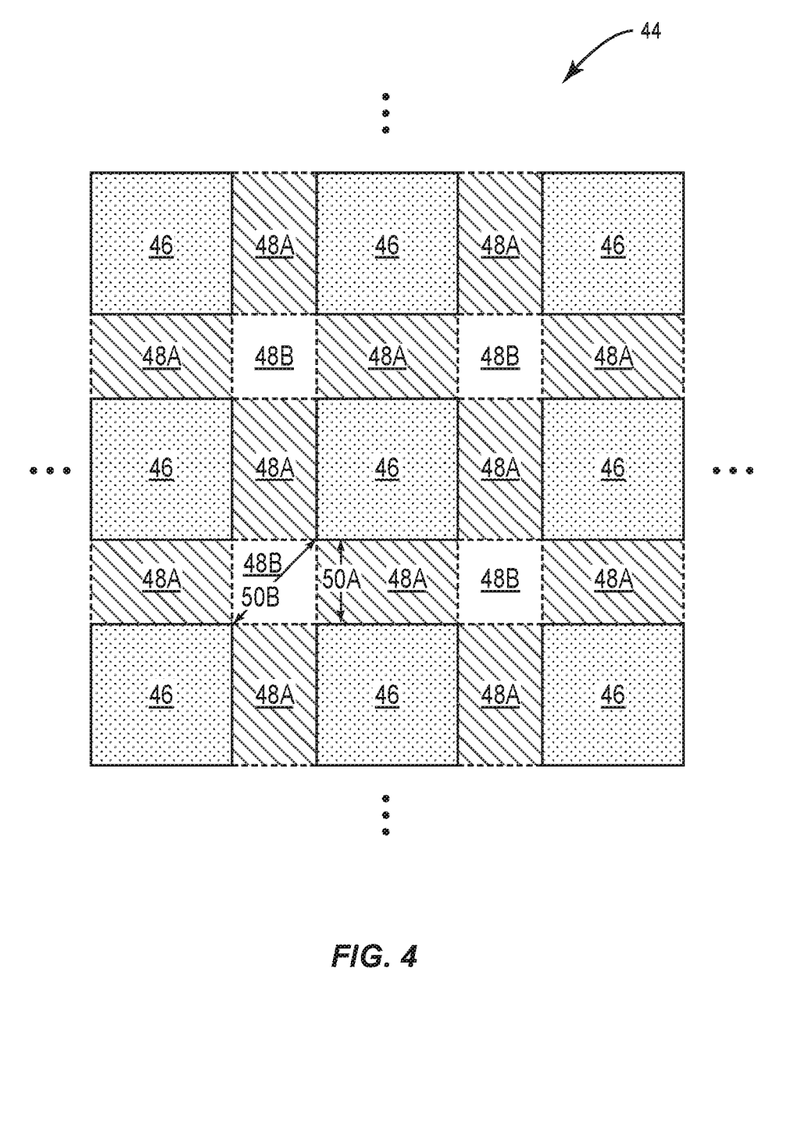
FIG. 4 illustrates a top-down view of a MOSFET device according to on embodiment of the present disclosure.

Accordingly, FIG. 4 shows a top-down view of the MOSFET device 44 according to one embodiment of the present disclosure. The MOSFET device 44 shown in FIG. 4 is substantially similar to that shown in FIG. 3, except that the JFET region 48 is separated into a first JFET sub-region 48A and a second JFET sub-region 48B, where the first JFET sub-region 48A has the first JFET gap 50A and the second JFET sub-region 48B has the second JFET gap 50B. The first JFET sub-region 48A has a first doping concentration, while the second JFET sub-region 48B has a second doping concentration that is different than the first doping concentration. In one embodiment, the doping concentration of the first JFET sub-region 48A is between $1 \times 10^{16}$ cm$^{-3}$ and $2 \times 10^{17}$ cm$^{-3}$ and the doping concentration of the second JFET sub-region 48B is between $1 \times 10^{15}$ cm$^{-3}$ and $5 \times 10^{16}$ cm$^{-3}$. In various embodiments, the doping concentration in the JFET region 48 may transition abruptly between the first JFET sub-region 48A and the second JFET sub-region 48B, or may transition gradually in a linear, exponential, step-wise, or any other manner. The doping concentration of the first JFET sub-region 48A and the second JFET sub-region 48B, as well as the transitions therebetween, may be obtained using masking before ion implantation of the sub-regions. The masking may require several steps, which may be reduced by using greyscale or pinhole masking.

Separating the JFET region 48 into the first JFET sub-region 48A and the second JFET sub-region 48B allows the trade-offs that occur between on-state resistance, blocking voltage, and peak electric field to be locally optimized within different parts of the MOSFET device 44. While only the first JFET sub-region 48A and the second JFET sub-region 48B are shown in FIG. 4, the JFET region 48 may be divided into any number of JFET sub-regions without departing from the principles of the present disclosure, each of which may have a different doping concentration. Designing the MOSFET device 44 as discussed above may allow the device to achieve performance parameters previously unobtainable in a cell-based design using conventional design principles, especially when the MOSFET device 44 is formed using a wide bandgap material system such as SiC. For example, in various embodiments the MOSFET device 44 may be capable of achieving an area normalized on-state resistance less than 2.5 mΩ-cm$^2$, less than 2.0 mΩ-cm$^2$, less than 1.8 mΩ-cm$^2$, and less than 1.6 mΩ-cm$^2$, a blocking voltage greater than 550 V, greater than 600 V, greater than 650 V, and greater than 700 V and a peak MOS oxide electric field less than 4.0 MV/cm, less than 3.8 MV/cm, less than 3.5 MV/cm, less than 3.2 MV/cm, and less than 3.0 MV/cm with a cell (or MOS channel) packing density greater than 300 mm/mm$^2$, greater than 330 mm/mm$^2$, greater than 370 mm/mm$^2$, and greater than 400 mm/mm$^2$.

Figure 5:
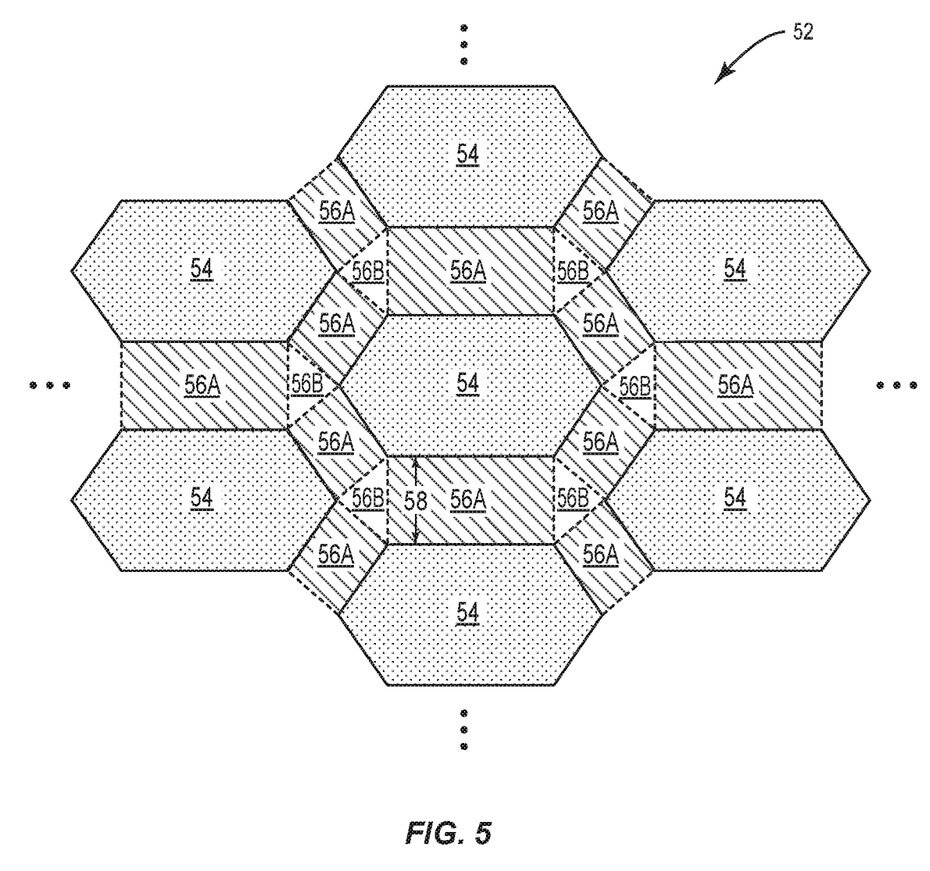
FIG. 5 illustrates a top-down view of a MOSFET device according to one embodiment of the present disclosure.

The principles of the present disclosure similarly apply to a MOSFET device 52 including a number of junction implants 54 arranged in a hexagonal cell configuration as shown in FIG. 5, which may provide even higher cell (or MOS channel) packing density than the rectangular cell configuration discussed above. Similar to the MOSFET device 44 shown in FIGS. 3 and 4, a JFET region 56 of the MOSFET device 52 has a non-uniform JFET gap 58. In particular, the JFET gap 58 of the MOSFET device 52 is different in a first JFET sub-region 56A and a second JFET sub-region 56B. In particular, the JFET gap 58 in the second JFET sub-region 56B is greater than the JFET gap 58 in the first JFET sub-region 56A. Due to the larger JFET gap 58 in the second JFET sub-region 56B, the MOSFET device 52 experiences a peak electric field at approximately the center of the second JFET sub-region 56B.

As discussed above, conventional design principles in which the JFET region 56 is uniformly doped require lowering the doping concentration of the entire JFET region 56 in order to prevent the peak electric field in the second JFET sub-region 56B from damaging the MOSFET device 52. The resulting doping concentration of the JFET region 56 makes certain combinations of on-state resistance and blocking voltages impossible to achieve, especially when the MOSFET device 52 uses a wide bandgap material system such as SiC. Accordingly, the first JFET sub-region 56A has a doping concentration that is greater than a doping concentration of the second JFET sub-region 56B. In one embodiment, the doping concentration of the first JFET sub-region 56A is between $1\times10^{16}$ cm$^{-3}$ and $2\times10^{17}$ cm$^{-3}$, and the doping concentration of the second JFET sub-region 56B is between $1\times10^{15}$ cm$^{-3}$ and $5\times10^{16}$ cm$^{-3}$. In various embodiments, the doping concentration of the first JFET sub-region 56A may be between $2\times10^{16}$ cm$^{-3}$ and $2\times10^{17}$ cm$^{-3}$, between $3\times10^{16}$ cm$^{-3}$ and $2\times10^{17}$ cm$^{-3}$, between $4\times10^{16}$ cm$^{-3}$ and $2\times10^{17}$ cm$^{-3}$, between $5\times10^{16}$ cm$^{-3}$ and $2\times10^{17}$ cm$^{-3}$, between $6\times10^{16}$ cm$^{-3}$ and $2\times10^{17}$ cm$^{-3}$, between $7\times10^{16}$ cm$^{-3}$ and $2\times10^{17}$ cm$^{-3}$, between $8\times10^{16}$ cm$^{-3}$ and $2\times10^{17}$ cm$^{-3}$, between $9\times10^{16}$ cm$^{-3}$ and $2\times10^{17}$ cm$^{-3}$, between $1\times10^{17}$ cm$^{-3}$ and $2\times10^{17}$ cm$^{-3}$, between $2\times10^{16}$ cm$^{-3}$ and $1\times10^{17}$ cm$^{-3}$, between $2\times10^{16}$ cm$^{-3}$ and $9\times10^{16}$ cm$^{-3}$, between $2\times10^{16}$ cm$^{-3}$ and $8\times10^{16}$ cm$^{-3}$, between $2\times10^{16}$ cm$^{-3}$ and $7\times10^{16}$ cm$^{-3}$, between $2\times10^{16}$ cm$^{-3}$ and $6\times10^{16}$ cm$^{-3}$, between $2\times10^{16}$ cm$^{-3}$ and $5\times10^{16}$ cm$^{-3}$, between $2\times10^{16}$ cm$^{-3}$ and $4\times10^{16}$ cm$^{-3}$, and between $2\times10^{16}$ cm$^{-3}$ and $3\times10^{16}$ cm$^{-3}$. The doping concentration of the second JFET sub-region 56B may be between $2\times10^{15}$ cm$^{-3}$ and $5\times10^{16}$, between $3\times10^{15}$ cm$^{-3}$ and $5\times10^{16}$, between $4\times10^{15}$ cm$^{-3}$ and $5\times10^{16}$, between $5\times10^{15}$ cm$^{-3}$ and $5\times10^{16}$, between $6\times10^{15}$ cm$^{-3}$ and $5\times10^{16}$, between $7\times10^{15}$ cm$^{-3}$ and $5\times10^{16}$, between $8\times10^{15}$ cm$^{-3}$ and $5\times10^{16}$, between $9\times10^{15}$ cm$^{-3}$ and $5\times10^{16}$, between $1\times10^{16}$ cm$^{-3}$ and $5\times10^{16}$, between $2\times10^{16}$ cm$^{-3}$ and $5\times10^{16}$, between $3\times10^{16}$ cm$^{-3}$ and $5\times10^{16}$, between $4\times10^{16}$ cm$^{-3}$ and $5\times10^{16}$, between $2\times10^{15}$ cm$^{-3}$ and $4\times10^{16}$, between $2\times10^{15}$ cm$^{-3}$ and $3\times10^{16}$, between $2\times10^{15}$ cm$^{-3}$ and $2\times10^{16}$, between $2\times10^{15}$ cm$^{-3}$ and $1\times10^{16}$, between $2\times10^{15}$ cm$^{-3}$ and $9\times10^{15}$, between $2\times10^{15}$ cm$^{-3}$ and $8\times10^{15}$, between $2\times10^{15}$ cm$^{-3}$ and $7\times10^{15}$, between $2\times10^{15}$ cm$^{-3}$ and $6\times10^{15}$, between $2\times10^{15}$ cm$^{-3}$ and $5\times10^{15}$, between $2\times10^{15}$ cm$^{-3}$ and $4\times10^{15}$, between $2\times10^{15}$ cm$^{-3}$ and $3\times10^{15}$. The doping concentration in the JFET region 56 may transition abruptly between the first JFET sub-region 56A and the second JFET sub-region 56B, or may transition gradually in a linear, exponential, step-wise, or any other manner. That is, the JFET region 56 may have a graded doping concentration (in the lateral direction, or both the lateral and vertical direction) such that transitions between the first JFET sub-region 56A and the second JFET sub-region 56B occur in a linear, exponential, step-wise, or any other manner. The doping concentration of the first JFET sub-region 56A and the second JFET sub-region 56B, as well as the transitions therebetween, may be obtained using masking before ion implantation of the sub-regions. The masking may require several steps, which may be reduced by using greyscale or pinhole masking.

As discussed above separating the JFET region 56 into the first JFET sub-region 56A and the second JFET sub-region 56B allows the trade-offs that occur between on-state resistance, blocking voltage, and peak electric field to be locally optimized within different parts of the MOSFET device 52. While only a first JFET sub-region 56A and a second JFET sub-region 56B are shown in FIG. 5, the JFET region 56 may be divided into any number of JFET sub-regions without departing from the present disclosure, each of which may have a different doping concentration. Designing the MOSFET device 52 as discussed above may allow the device to achieve performance parameters previously unobtainable in a cell-based design using conventional design principles, especially when the MOSFET device 52 is formed using a wide bandgap material system such as SiC. For example, the MOSFET device 52 may be capable of achieving an area normalized on-state resistance less than 2.5 mΩ-cm$^2$, less than 2.0 mΩ-cm$^2$, less than 1.8 mΩ-cm$^2$, and less than 1.6 mΩ-cm$^2$, a blocking voltage greater than 550 V, greater than 600 V, greater than 650 V, and greater than 700 V and a peak MOS oxide electric field less than 4.0 MV/cm, less than 3.8 MV/cm, less than 3.5 MV/cm, less than 3.2 MV/cm, and less than 3.0 MV/cm with a cell (or MOS channel) packing density greater than 300 mm/mm$^2$, greater than 330 mm/mm$^2$, greater than 370 mm/mm$^2$, and greater than 400 mm/mm$^2$.

While discussed above with respect to rectangular and hexagonal cell designs, the principles of the present disclosure apply equally to any MOSFET device wherein the JFET gap is not uniform throughout the device. That is, the present disclosure may be applied to MOSET devices having cells of any shape or size.

Figure 6:
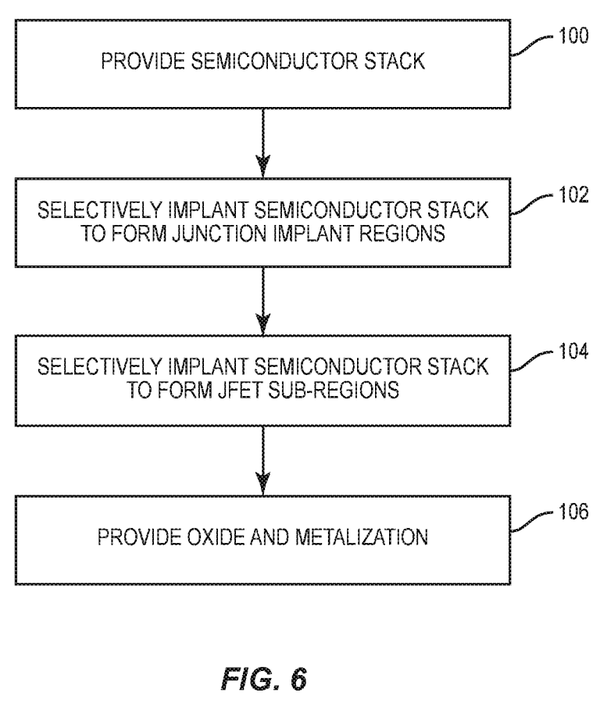
FIG. 6 illustrates a method for manufacturing a MOSFET device according to one embodiment of the present disclosure.

FIG. 6 is a flow diagram illustrating a method for manufacturing a MOSFET device according to one embodiment of the present disclosure. First, a semiconductor stack is provided (step 100), where the semiconductor stack includes at least a substrate and a drift layer over the substrate. The semiconductor stack is then selectively implanted to form a number of junction implant regions (step 102). As discussed above, the junction implants may be provided in a cell configuration in which a JFET gap between the junction implants is not the same in all parts of the device. Accordingly, the semiconductor stack is then implanted to form at least two JFET sub-regions (step 104). As discussed above, the JFET sub-regions have different doping concentrations in order to separately optimize the regions for on-state resistance, blocking voltage, and peak electric field. Finally, oxide and metallization layers are provided (step 106) in order to complete the MOSFET device.

Those skilled in the art will recognize improvements and modifications to the preferred embodiments of the present disclosure. All such improvements and modifications are considered within the scope of the concepts disclosed herein and the claims that follow.

What is claimed is:

1. A transistor device comprising:
   a wide bandgap substrate;
   a wide bandgap drift layer over the wide bandgap substrate;
   a plurality of junction implants in the wide bandgap drift layer; and
   a junction field-effect transistor (JFET) region between the plurality of junction implants,
   wherein:
      the JFET region is defined by a JFET gap, which is a distance between adjacent ones of the plurality of junction implants;
      the JFET gap is not uniform throughout the transistor device;
      the JFET region is separated into a first JFET sub-region and a second JFET sub-region;
      a doping concentration of the first JFET sub-region is different from a doping concentration of the second JFET sub-region; and
      a transition between the first JFET sub-region and the second JFET sub-region comprises a graded doping concentration that changes in at least one of a linear and step-wise manner in a lateral direction between the doping concentration of the first JFET sub-region and the doping concentration of the second JFET sub-region.

2. The transistor device of claim 1 wherein a JFET gap within the first JFET sub-region is different from a JFET gap within the second JFET sub-region.

3. The transistor device of claim 2 wherein the JFET gap within the first JFET sub-region is smaller than the JFET gap within the second JFET sub-region.

4. The transistor device of claim 3 wherein the doping concentration of the first JFET sub-region is greater than the doping concentration of the second JFET sub-region.

5. The transistor device of claim 1 wherein:
   the wide bandgap substrate has a first doping type;
   the wide bandgap drift layer has the first doping type; and
   the plurality of junction implants each have a second doping type, which is the opposite of the first doping type.

6. The transistor device of claim 1 wherein each one of the plurality of junction implants is rectangular.

7. The transistor device of claim 1 wherein each one of the plurality of junction implants is hexagonal.

8. The transistor device of claim 1 wherein the wide bandgap substrate and the wide bandgap drift layer comprise silicon carbide (SiC).

9. The transistor device of claim 1 wherein the transistor device provides an area normalized on-state resistance less than 2 m$\Omega$-cm$^2$ and is capable of blocking at least 650 V.

10. The transistor device of claim 1 wherein the doping concentration of the first JFET sub-region is in a range between $1\times10^{16}$ cm$^{-3}$ and $2\times10^{17}$ cm$^{-3}$ and the doping concentration of the second JFET sub-region is in a range between $1\times10^{15}$ cm$^{-3}$ and $5\times10^{16}$ cm$^{-3}$.

11. A transistor device comprising:
   a wide bandgap substrate;
   a wide bandgap drift layer over the wide bandgap substrate; and
   a plurality of junction implants in the wide bandgap drift layer, the plurality of junction implants arranged in a cell configuration; and
   a junction field-effect transistor (JFET) region that comprises a variable doping concentration with a transition that changes in at least one of a linear and step-wise manner in a lateral direction relative to a surface of the wide bandgap drift layer, wherein the transistor device provides an area normalized on-state resistance less than 2 m$\Omega$-cm$^2$ and is capable of blocking at least 650 V.

12. The transistor device of claim 11 wherein the wide bandgap substrate and the wide bandgap drift layer comprise silicon carbide (SiC).

13. The transistor device of claim 11 wherein a cell (MOS channel) packing density of the transistor device is greater than 370 mm/mm$^2$.

14. The transistor device of claim 11 wherein each one of the plurality of junction implants is rectangular.

15. The transistor device of claim 11 wherein each one of the plurality of junction implants is hexagonal.

16. The transistor device of claim 11 wherein the variable doping concentration transitions gradually from a first doping concentration that is in a range between $1\times10^{16}$ cm$^{-3}$ and $2\times10^{17}$ cm$^{-3}$ to a second doping concentration that is in a range between $1\times10^{15}$ cm$^{-3}$ and $5\times10^{16}$ cm$^{-3}$ wherein the second doping concentration is different from the first doping concentration.

17. A method for manufacturing a metal-oxide-semiconductor field-effect transistor (MOSFET) device comprising:
   providing a semiconductor stack including a wide bandgap substrate and a wide bandgap drift layer over the wide bandgap substrate;
   providing a plurality of junction implants in the wide bandgap drift layer; and
   providing a junction field effect transistor (JFET) region between the plurality of junction implants, wherein:
      the JFET region is defined by a JFET gap, which is a distance between adjacent ones of the plurality of junction implants;
      the JFET gap is not uniform throughout the MOSFET device;
      the JFET region is separated into a first JFET sub-region and a second JFET sub-region;

a doping concentration of the first JFET sub-region is different from a doping concentration of the second JFET sub-region; and a transition between the first JFET sub-region and the second JFET sub-region comprises a graded doping concentration that changes in at least one of a linear and step-wise manner between the doping concentration of the first JFET sub-region and the doping concentration of the second JFET sub-region.

18. The method of claim 17 wherein the graded doping concentration is formed by at least one of a multiple-step masking process, greyscale masking, and pinhole masking.

19. The method of claim 17 wherein the MOSFET device provides an area normalized on-state resistance less than 2 mΩ-cm$^2$ and is capable of blocking at least 650 V.

20. The method of claim 17 wherein a JFET gap within the first JFET sub-region is different from a JFET gap within the second JFET sub-region.

21. The method of claim 20 wherein the JFET gap within the first JFET sub-region is smaller than the JFET gap within the second JFET sub-region.

22. The method of claim 21 wherein the doping concentration of the first JFET sub-region is greater than the doping concentration of the second JFET sub-region.

* * * * *